Figure 1A:
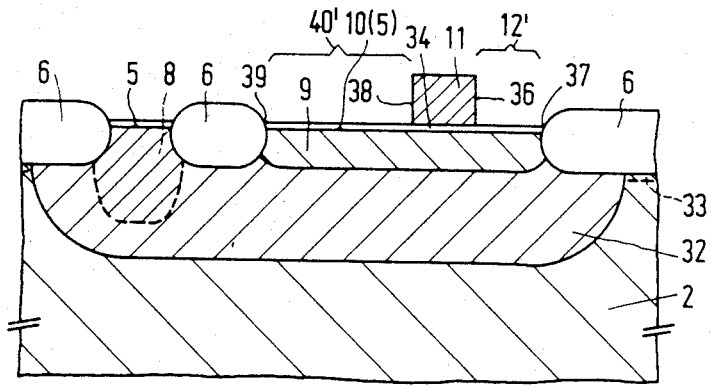

United States Patent [19]

Josquin

[11] Patent Number: 4,859,630
[45] Date of Patent: Aug. 22, 1989

[54] METHOD OF MANUFACTURING A SEMICONDUCTOR DEVICE

[75] Inventor: Wilhelmus J. M. J. Josquin, Eindhoven, Netherlands

[73] Assignee: U.S. Philips Corporation, New York, N.Y.

[21] Appl. No.: 25,554

[22] Filed: Mar. 13, 1987

[51] Int. Cl.⁴ .................. H01L 29/78; H01L 21/225
[52] U.S. Cl. ................................. 437/203; 437/31;
437/33; 437/34; 437/59; 437/44; 357/34;
357/43; 148/DIG. 11
[58] Field of Search .................. 437/31, 33, 203;
148/DIG. 11; 357/43, 34, 35

[56] References Cited

U.S. PATENT DOCUMENTS

| 4,346,512 | 8/1982 | Liang et al. | 29/577 C |
| 4,486,942 | 12/1984 | Hirao | 156/662 |
| 4,497,106 | 2/1985 | Momma et al. | 357/43 |
| 4,641,420 | 2/1987 | Lee | 148/DIG. 19 |

FOREIGN PATENT DOCUMENTS 0033186  8/1980  Japan ..................................... 357/43

OTHER PUBLICATIONS

Ghandhi, *VLSI Fabrication Principles*, John Wiley & Sons, N.Y., pp. 458–461.

Primary Examiner—Brian E. Hearn
Assistant Examiner—Beverly A. Pawlikowski
Attorney, Agent, or Firm—Paul R. Miller

[57] ABSTRACT

A method of manufacturing an integrated circuit is set forth comprising a field effect transistor having an insulated gate (35) and a further circuit element having a first (9) and a second electrode zone (14) of opposite conductivity types. Simultaneously with the gate (35) a conductive pattern (11) separated by an insulating layer (34) from the first electrode zone (9) is provided on the first electrode zone (9). This pattern (11) provides a pair of the edge of the doping opening (12) for the second electrode zone (14). A second insulating layer (16) is provided on the pattern (11) and is removed locally by anisotropic etching in such a manner that in the doping opening (12) edge portions (17) (16) are left. Subsequently, a conductive layer (22) for connection of the second electrode zone (14) is provided, which extends over the second insulating layer (16), over the pattern (11) and over the edge portions (17) (16) into the opening (12) of reduced size and on the second electrode zone (14). The contact opening for the second electrode zone (14) can thus be derved without alignment tolerance from the doping opening (12).

6 Claims, 3 Drawing Sheets

METHOD OF MANUFACTURING A SEMICONDUCTOR DEVICE

The invention relates to a method of manufacturing an integrated circuit comprising a semiconductor body having a surface adjoined by a first and a second surface region, the first surface region being of a first conductivity type and being intended to accomodate at least one field effect transistor having an insulated gate, a source and a drain zone of the second conductivity type and the second surface region being intended to accomodate at least one further circuit element having a first electrode zone which adjoins the surface and occupies a first surface portion of the surface, as well as a second electrode zone which adjoins the surface in the first surface portion and which has a conductivity type opposite to that of the first electrode zone with a pattern of conductive material being provided on an already present first insulating layer above at least a part of the first electrode zone simultaneously with the gate electrode of the field effect transistor, which pattern defines at least a first part of the edge of a first opening to be used in a first doping treatment for providing a dopant for the second electrode zone, in which a part of the first insulating layer located in the first opening is removed, and after the first doping treatment, in which simultaneously a dopant is provided for the second electrode zone and for the source and drain zones of the field effect transistor, a second layer of insulating material is provided on the pattern and in the first opening, the second insulating layer being locally removed with the use of a masking layer having second openings and in which a conductive layer for electrical connection of the second electrode zone is provided, which is located on a second surface portion of the second electrode zone.

Such a method is known from Federal German Patent Application (DE-A) 3023616, which has been laid open to public inspection on Jan. 22$^{nd}$1981. In this case, beside the field effect transistor a lateral bipolar transistor is formed, whose base zone constitutes the first electrode zone and whose emitter zone constitutes the second electrode zone, while the part of the base zone located between the emitter zone and the collector zone is covered with a conductive pattern, on an insulating layer, which surrounds the emitter zone like a ring and may be connected to the electrical connection of the emitter zone. The conductive pattern serves to reduce the recombination of charge carriers at the surface in the subjacent part of the base zone. The bipolar transistor is manufactured thus in order that the electrical connections of the emitter zone and of the collector zone can be provided at a comparatively small relative distance and nevertheless a conductive layer can be formed at the same time above the part of the base zone. Due to the fact that the emitter and/or the collector connections can overlap the conductive pattern located above the base zone, an area saving is obtained in this structure.

The present invention has inter alia for its object to indicate how during the manufacture of integrated circuits comprising field effect transistors and in bipolar circuit elements, more particularly bipolar transistors, comparatively small electrode zones can be used.

In a known method of forming comparatively small electrode zones in bipolar circuit elements, an opening in an insulating layer is first used as a doping opening for providing the dopant for the relevant small electrode zone in the semiconductor body and is then also used as a contact opening for connecting the electrical connection for this electrode zone which is provided in the form of a conductive layer to this electrode zone. In this case, the usual alignment tolerance with respect to the doping opening need not be taken into account for the provision of the contact opening. This method is used, for example, in so-called "washed-out" emitters.

In the most frequently used method of manufacturing integrated circuits comprising field effect transistors, the gate electrode is employed as a masking when the dopant for the source and drain zones is provided. In a later processing step, contact openings are provided above the source and drain zones by means of a mask. If these integrated circuits also include bipolar circuit elements having an electrode zone which is provided simultaneously with the source and drain zones, also in this circuit element the pattern for the contact opening has to be aligned with respect to the relevant electrode zone. The method described above and used with "washed-out" emitters is consequently not suitable to be used in this process.

Another disadvantage of the method described, which is used with "washed-out" emitters, is that as the dimensions in the integrated circuits become smaller and as a result the electrode zones become shallower, the risk increases that the pn junction limiting the relevant electrode zone is found to be shortcircuited within the contact opening by the electrical connection of the electrode zone. Such a shortcircuit may be due inter alia to the fact that the doping opening has to be cleaned after the doping treatment and before the formation of the electrical connection. It is practically inevitable that the edges of the doping opening are also slightly etched during this cleaning or washing step.

The present invention has inter alia also for its object to avoid at least to a considerable extent the aforementioned disadvantages associated with the use of comparatively small electrode zones. It is based inter alia on recognition of the fact that also in a method in which gate electrodes are employed in a usual manner as a masking during the step of providing the doping for source and drain zones in bipolar circuit elements, such as bipolar transistors, where required, the alignment tolerance for providing contact openings can practically be eliminated.

According to the invention, a method of the kind described in the opening paragraph is characterized in that during the step of locally removing the second layer a second opening is located above the second electrode zone in such a manner that the first part of the edge of the first opening is located at least in part within the second opening, in that this step of locally removing the second insulating layer is carried out by anisotropic etching in such a manner that an edge portion of the second insulating layer located along the part of the edge of the pattern disposed within the second opening is left in the first opening, after which the conductive layer is provided in such a manner that the second surface part extends practically to the edge of the first opening at the area at which this edge is located within the second opening.

In the method according to the invention, at the same processing stage at which the gate electrode of the field effect transistor is formed, a conductive pattern separated by an insulating layer from the first electrode zone is provided in the further circuit element, which is mostly a bipolar circuit element. This conductive pattern is used to define, where required, a part of the boundary or the entire boundary of a doping opening for providing the second electrode zone. After the doping treatment has been carried out, the contact opening for the second electrode zone is derived from the boundary of the doping opening defined by the pattern in that a deposited insulating layer is removed locally by anisotropic etching in such a manner that edge portions of this insulating layer are left along the boundary. Thus, i.e. due to the fact that the contact opening is derived from the doping opening, it is avoided that for this contact opening an alignment tolerance with respect to the doping opening has to be taken into account. Moreover, the advantage is obtained that the contact opening is smaller than the doping opening. As a result, pn junctions located at a very small depth will also remain satisfactorily passivated when the conductive connection for the second electrode zone is provided.

As far as the second surface part extends practically to the edge of the first opening, the contact opening in situ has practically the same size as the doping opening. The term "practically the same size" indicates that the contact opening is derived in situ from the relevant part of the edge of the doping opening without taking into account the usual alignment tolerance.

In a particular preferred embodiment of the method according to the invention, the second surface region is of the second conductivity type with the first electrode zone being of the first conductivity type and being situated in the second surface region, and the first doping treatment is carried out so that the second electrode zone of the second conductivity type is separated by the first electrode zone of the first conductivity type from the part of the second surface region of the second conductivity type adjoining the first electrode zone. The structure thus obtained can constitute as the further circuit element a vertically constructed bipolar transistor.

Advantageously, the first insulating layer is provided simultaneously with a further insulating layer, which is intended to separate the gate electrode of the field effect transistor from the first surface region. In this manner, the first insulating layer can be obtained without additional processing steps being required during the manufacture of the integrated circuit.

A further preferred embodiment of the method according to the invention is characterized in that a pattern of a refractory material is used as the conductive pattern.

Preferably, the conductive pattern is a pattern formed from one or more materials chosen from the group comprising titanium, tantalum, tungsten, molybdenum, semiconductor material and silicides of these materials.

Figure 1B:
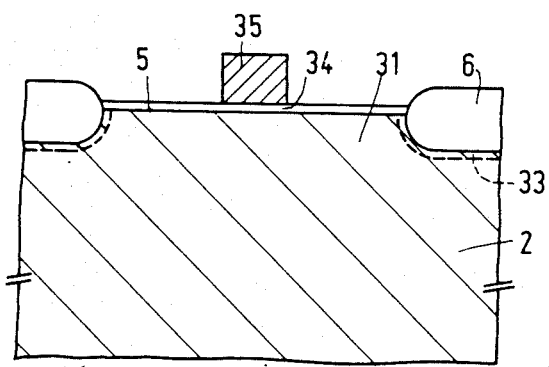
Figure 2B:
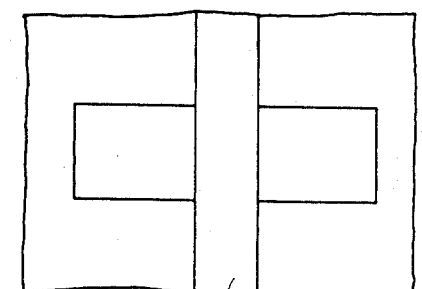
Figure 2A:
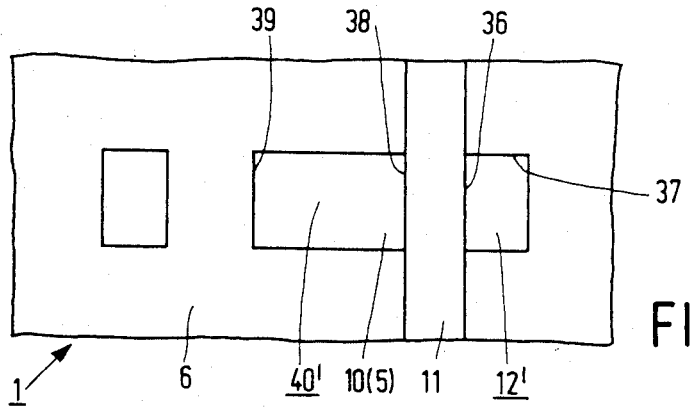

The invention further relates to a semiconductor device manufactured by the use of the method according to the invention. The invention will be described more fully with reference to an embodiment and the accompanying diagrammatic drawing (not to scale), in which:

FIG. 1A and FIG. 1B are cross-sections of various parts of a semiconductor device during a first stage of the manufacture, FIG. 2A and FIG. 2B are associated plan views of the parts shown in FIGS. 1A/B, and FIGS. 3A and 3B, 4A and 4B, 5A and 5B, and 6A and 6B are cross-sections of these parts at further stages of the manufacture.

The embodiment is an integrated circuit comprising field effect transistors having an insulated gate, which may have an n-type channel or a p-type channel, and one or more bipolar transistors having a vertical structure. For the sake of clarity, in the respective FIGS. 1A,B to 6A,B only a field effect transistor having an n-type channel and a vertical npn transistor are shown, the diagrammatic Figures each being divided into two associated parts A and B, which show various parts of the same common semiconductor body 1. The part A relates to the bipolar transistor and the part B relates to the field effect transistor.

FIGS. 1A,B show a semiconductor body 1, which comprises, for example, a p-type silicon substrate or substrate region 2 and is provided in a usual manner with one or more n-type surface regions 32 having a suitably chosen doping concentration profile. The surface regions 32 may be obtained, for example, by means of ion implantation, while, if desired, also first a part of the doping may be provided in a substrate, after which a p-type epitaxial layer may be grown and then additionally a further doping may be provided through the surface 5 of the semiconductor body 1 in the epitaxial layer not shown.

Besides the n-type surface regions 32, the doping concentration profile in p-type surface regions 31 of the substrate 2 may be adapted, for example by implantation in a usual manner to the circuit elements to be formed and the desired electrical properties thereof.

The semiconductor body 1 may further be provided in a usual manner with a deep contact zone 8, with a p-type channel stopper zone 33, and with a pattern of field insulation 6. The latter pattern may be obtained, for example, by local oxidation of the semiconductor body 1. The pattern then consists of silicon oxide. Other conventional forms of field insulation, such as filled grooves, may also be used. The field insulation 6 limits at the surface 5 active regions for the transistors to be formed. For example, the semiconductor body 1 may also comprise one or more n-type surface regions 32 (not shown) which are intended to accomodate in a conventional manner one or more field effect transistors having an insulated gate electrode and a p-type channel. In surface regions 32 intended to accomodate field effect transistors, the deep contact zone 8 may be omitted.

In the active regions the surface 5 is provided with an insulating layer 34, which is suitable for use as a dielectric layer for the gate electrodes of the field effect transistors. For example, the layer 34 is obtained by thermal oxidation of the semiconductor body 1. The thickness of the layer 34 may lie, for example, between about 25 and 50 nm. Subsequently, by means of a photolacquer mask (not shown) a dopant for the p-type base zone 9 (the first electrode zone) is implanted in a part of the surface region 32.

A suitable dose is, for example, about $1 \times 10^{14}$ boron atoms/cm$^2$. The implantation energy is, for example, about 30 keV. The base zone 9 occupies a first part 10 (5) of the surface 5. Subsequently, a conductive layer of, for example, polycrystalline or amorphous silicon or of titanium, tantalum, molybdenum or tungsten is provided. If a silicon layer is used as conductive layer, this layer can be doped in a usual manner during the deposition or thereafter, for example by means of PH$_3$. The thickness of such a silicon layer is, for example, 500 nm.

From this layer there is formed besides the gate electrode 35 also a pattern 11 of conductive material which is located above the base zone 9 on the first insulating layer 34 already present. The pattern 11 defines at least a first part 36 of the edge 36,37 of an opening 12' (cf. also FIGS. 2A,B). The remaining part 37 of the edge 36,37 of the opening 12' may coincide practically, for example, with a part of the edge of the pattern of field insulation 6. The opening 12' may also be defined as a whole by the pattern 11. In this case, the pattern 11 is, for example, annular or it has at least a closed geometry with the edge 36 being located around and at a certain distance from the edge of the pattern of field insulation 6 above the base zone 9.

In the present embodiment, the pattern 11 also defines the part 38 of the edge 38,39 of a further opening 40', which is located beside the opening 12' also above the first surface part 10 (5). The remaining part 39 of this edge 38,39 practically coincides with a part of the edge of the pattern of field insulation 6.

If a further insulating layer is provided on the conductive layer and this layer is then patterned simultaneously with the conductive layer, the gate electrode 35 and the pattern 11 are covered on the upper side with an insulating layer (not shown). This insulating layer may comprise, for example, silicon nitride or silicon oxide.

Figure 3A:
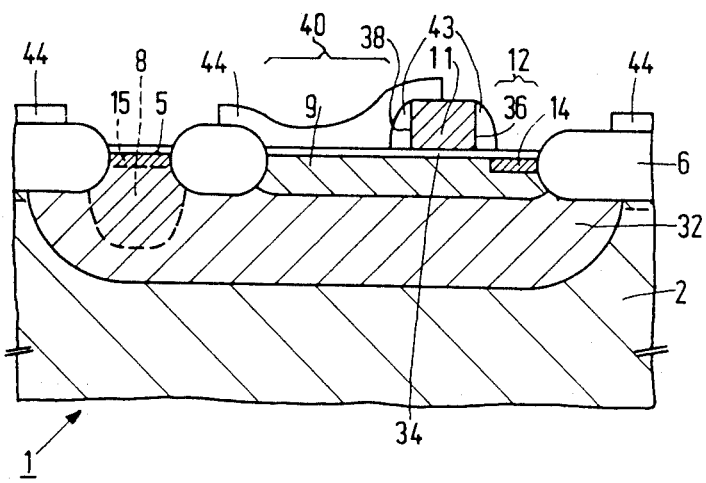
Figures 3B, 4B:
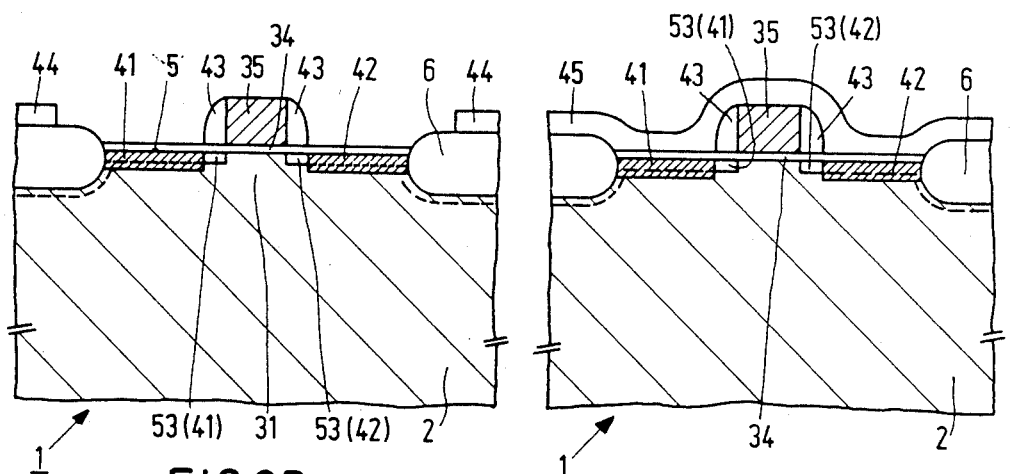
Figure 4A:
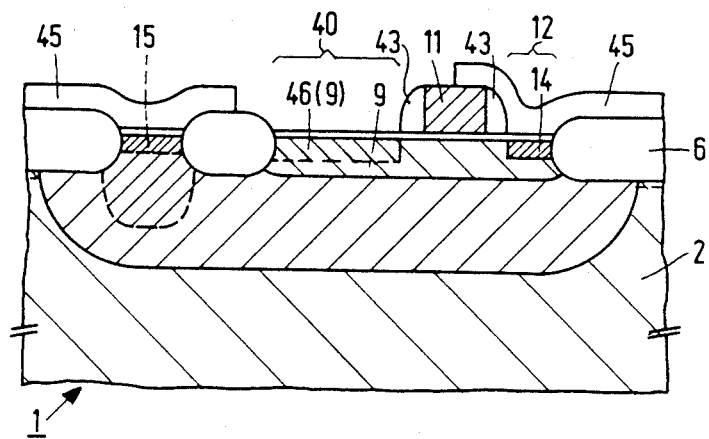

After the gate electrode 35 and the pattern 11 have been obtained, a doping for source and drain zones 41 and 42 of the field effect transistor is locally provided preferably in the surface region 31 (FIG. 3A,B). For example, phosphorus may be implanted at a dose of about $1 \times 10^{13}/cm^2$ and an implantation energy of about 60 keV. This doping treatment serves to provide comparatively weakly doped parts 53 of the source zone 41 and the drain zone 42. During this doping treatment, the part of the surface 5 intended for the source zone 41 may also be screened by means of a masking layer (not shown) so that only the drain zone 42 has a comparatively weakly doped part 53 (42).

Subsequently, an insulating layer of, for example, silicon oxide having a thickness of about 300 nm is deposited on the entire surface of the semiconductor body 1. This insulating layer is removed again in a usual manner by anisotropic etching, edge portions 43 being left along the upright edges of the gate electrode 35 and the upright edges 36 and 38 of the pattern 11. As far as the edges of the pattern of field insulation 6, such as the edges 37 and 39, are sufficiently steep, edge portions of this insulating layer will be maintained also along these edges. Such edge portions are not shown in the Figures for the sake of simplicity.

As a result of the treatment last described, openings 12 and 40 of reduced size are obtained inter alia at the area of the openings 12' and 40'.

A masking layer 44 is provided on the structure obtained and this masking layer may consist, for example, of photoresist and covers the opening 40. With the aid of this masking layer 44, a dopant is locally implanted for the source and drain zones 41 and 42 or at least for highly doped surface parts of these zones 41 and 42. Simultaneously, a dopant for the emitter zone 14 (the second electrode zone) of the bipolar transistor is implanted. At this stage, a dopant for a shallow collector contact zone 15 may be provided. For example arsenic ions are implanted at a dose of about $5 \times 10^{15}/cm^2$ and an implantation energy of about 40 keV. After this treatment, the layer 44 is removed.

By means of a subsequent masking layer 45 (FIGS. 4A,B), the openings for the source and drain zones 41 and 42 and the opening 12 can now be screened and a doping treatment can be carried out, in which a dopant is provided in the opening 40. For example, BF$_2$ ions may be used to implant boron. This dose may be about $3 \times 10^{15}/cm^2$ and the implantation energy is, for example, about 65 keV. This dopant serves to provide a more highly doped base contact zone 46 (9). During this doping treatment, where required, a dopant for source and drain zones of field effect transistors having a p-type channel may also be provided in the semiconductor body 1. After this doping treatment, the layer 45 is removed. Also during this doping treatment, the pattern 11 provided with edge portions 43 is used as a doping mask, the pattern 11 now defining the edge of the doping opening 40 facing the second electrode zone 14.

Figure 5A:
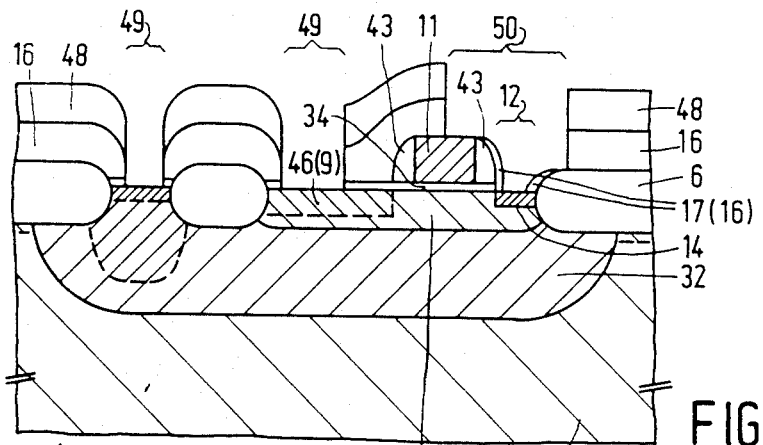
Figures 5B, 6B:
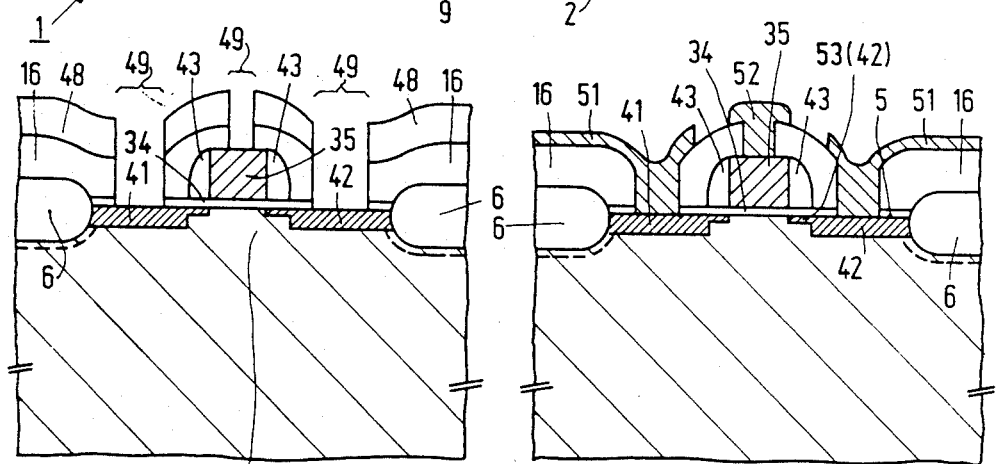

A subsequent treatment consists in providing an insulating layer 16 (FIGS. 5A,B). For example, silicon oxide is deposited in a thickness of about 500 nm. Preferably, the thickness of the layer 16 is not smaller than 100 to 150 nm. The insulating layer 16 constitutes the second insulating layer of the method according to the invention. After the layer 16 has been provided, for example, an annealing treatment may be carried out for about one hour at about 925° C. Due to this treatment, where required, the dopants provided are activated.

A masking layer 48 is provided on the insulating layer 16 and this masking layer may consist, for example, of photoresist, while second openings 49 and 50 are provided in this masking layer. Within the scope of the present invention, the second opening 50 located above the second electrode zone 14 is especially of importance. This second opening 50 is positioned so that the edge of the first opening 12 derived from the edge 36 of the pattern 11, that is to say the part of the first opening 12 bounded by the edge portion 43, is located at least in part within the second opening 50.

Subsequently, the semiconductor body 1 is subjected to an anisotropic etching treatment, in which openings are obtained in the second insulating layer 16, while, where required, the parts of the first insulating layer 34 located within the openings 49 and 50 are also removed. Especially the opening 49 located above the gate electrode 35 is indicated only diagrammatically. In practical embodiments, this opening 49 will mostly be located not above the channel region of the transistor, but outside the cross-section shown beside the transistor and above the field insulation 6. Within the opening 50, edge portions 17 (16) of the second insulating layer 16 are left along the edge of the first opening 12.

In a modification of the method described, during the etching treatment, in which the openings 12 and 40 (FIGS. 3A,B) are obtained, the etching is already continued for such a long time that the parts of the first insulating layer 34 located in these openings 12 and 40 are also removed. The doping treatments subsequent to this etching treatment and described already hereinbefore in this case may be carried out with an adapted implantation energy.

Figure 6A:
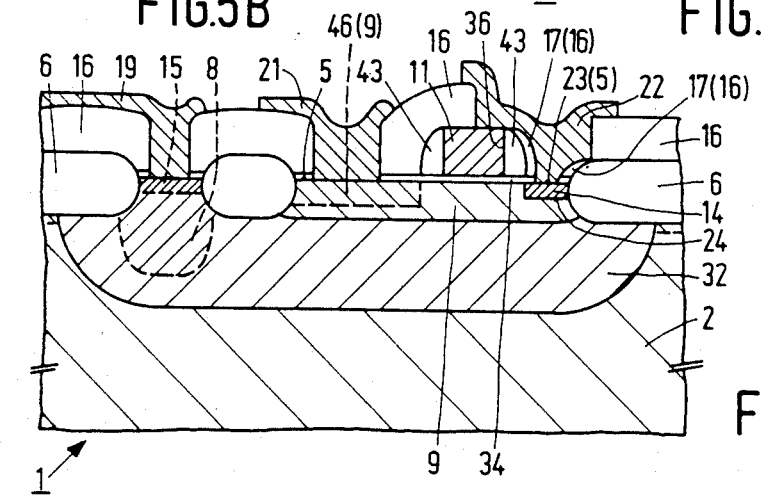

After the second insulating layer 16 has been etched, the masking layer 48 can be removed and a conductive layer of a suitable material, such as aluminium, can be provided (FIGS. 6A,B). In a usual manner, there can be formed from this conductive layer the conductive layer 19 for connection of the collector zone 32,8,15, the conductive layer 21 for connection of the base zone 9,46, the conductive layer 22 for connection of the emitter zone 14, the conductive layers 51 for connection of the source and drain zones 41 and 42 and the conductive layer 52 for connection of the gate electrode 35. The result is inter alia that the conductive layer 22 for connection of the emitter zone 14 is located on a second surface part 23 (5) of the emitter zone 14, which second surface part 23 (5) extends at least at the area at which the edge of the first opening 12 derived from the edge 36 is located within the second opening 50, practically to that edge of the first opening. The surface part 23 (5) of the emitter zone 14 has at least at this area practically the same size as the doping opening 12. The contact opening for the emitter zone 14 is derived from the doping opening 12 without taking into account the usual alignment tolerance.

The use of the method according to the invention renders it possible to utilize very small second electrode or emitter zones, which are separated from the first electrode or base zone 9 by a pn junction 24 located at a comparatively small depth. The edge portions 17 (16) provided prevent that this pn junction 24 located at a small depth is shortcircuited at the surface 5 by the conductive layer 22.

This embodiment is a preferred embodiment, in which the second surface region 32 is of the second conductivity type, the first electrode zone 9 is of the first conductivity type and is situated in the second surface region 32 and the first doping treatment is carried out so that the second electrode zone 14 of the second conductivity type is separated by the first electrode zone 9 of the first conductivity type from the part of the second surface region 32 of the second conductivity type adjoining the first electrode zone 9. The resulting further circuit element 14,9,32 is a vertically constructed bipolar transistor.

The second electrode zone 14 may also be one of the main electrode zones of a laterally constructed bipolar transistor with the first electrode zone constituting the control electrode zone (the base zone) of this transistor. Especially in the last-mentioned embodiment, the first electrode zone may be a part of an epitaxial layer which, if required, may be isolated from the adjoining part of the semiconductor body.

The further circuit element may also be a diode having an anode zone and a cathode zone or a pn junction field effect transistor, the second electrode zone then constituting, for example, a gate electrode.

Preferably, the first insulating layer 34 located below the pattern 11 of conductive material has practically the same thickness as and is obtained simultaneously with the gate dielectric 34, which separates the gate electrode 35 of the field effect transistor 41,35,42 from the first surface region 31. The thickness of this insulating layer 34 lies, for example, between about 20 and 50 nm.

Advantageously, a pattern of refractory conductive material is used as the conductive pattern 11. Preferably, the pattern 11 is formed from one or more materials chosen from the group comprising titanium, tantalum, tungsten, molybdenum, semiconductor material and silicides of these materials.

In the embodiment, the pattern 11 of conductive material in the second opening 50 in the second insulating layer 16 is directly conductively connected to the conductive layer 22. However, if an insulating layer of, for example, silicon nitride or silicon oxide is used on the conductive pattern 11, as suggested above in a modification, and if this nitride or oxide layer in the opening 50 is not removed, the pattern 11 and the conductive layer 22 are isolated from each other. In such a structure, the conductive pattern 11 can be provided with a conductive connection at a suitably chosen area (not shown) through a further opening in the insulating layer 16, in which the nitride or oxide layer is removed indeed. For example, the conductive pattern 11 may be connected in this manner to the conductive layer 21.

The invention is not limited to the embodiment described. It will be appreciated that within the scope of the invention many variations are possible for those skilled in the art. For example, semiconductor materials other than silicon, such as germanium and $A^{III}B^{V}$ compounds, may be used. Furthermore, the conductivity types described may be inverted and other usual dopants may be employed. As insulating material, for example, oxynitride is also suitable. If for the gate electrode and for the pattern use is made of semiconductor material, this may optionally be n- or p-doped, while, if required, it may moreover be converted entirely or in part into a suitable silicide. In a usual manner, several semiconductor devices may be formed simultaneously in a semiconductor wafer, which is then subdivided into separate semiconductor bodies 1. The semiconductor devices may then be finished in a usual manner in a conventional envelope.

What is claimed is:

1. A method of manufacturing an integrated circuit including a semiconductor body having a surface with at least one field effect transistor at a first surface region and with at lest one further circuit element at a second surface region, said method comprising the steps of
    providing a pattern of a first insulating layer on the semiconductor body;
    forming at least one field effect transistor at the first surface region through said first insulating layer, said at least one field effect transistor including an insulated gate region, a source zone and a drain zone;
    forming at least one semiconductor device at the second surface region through said first insulating layer, said at least one semiconductor device being formed by the steps comprising
    providing a first semiconductor layer of a first conductivity type on said semiconductor body at said second surface region,
    providing a second semiconductor layer of a second conductivity type on at least a part of said first semiconductor layer,
    providing a second insulating layer on at least said second semiconductor layer,
    providing a pattern of conductive material on said second insulating layer, said pattern of conductive material being provided simultaneously with said gate region at said first surface region, and said pattern of conductive material having at least a first edge separated from said first insulating layer,
    forming a third semiconductor layer of said first conductivity type in said second semiconductor layer at a space located between said first edge and said first insulating layer by doping said second semiconductor layer at said space, said doping also simultaneously forming said source zone and said drain zone at said first surface region,
    removing a part of said second insulating layer in said space located between said first edge and said first insulating layer,
    providing a third layer of insulating material over said semiconductor body, locally removing by anisotropic etching parts of said third layer of insulating material in said space to expose only a portion of said third semiconductor layer, forming a conductive layer to contact the exposed portion of said third semiconductor layer; and simultaneously forming conductive portions to said at least one field effect transistor in said first surface region and to said at least one semiconductor device in said second surface region.

2. A method according to claim 1, wherein simultaneously with said step of providing said second insulating layer a further insulating layer is provided for separating said gate region of said at least one field effect transistor from said first surface region.

3. A method according to claim 2, wherein said second semiconductor layer is formed with a highly doped surface region separated from said third semiconductor layer, and wherein at least one of said conductive portions is in contact with said highly doped surface region.

4. A method according to claim 1, wherein said second semiconductor layer is formed with a highly doped surface region separated from said third semiconductor layer, and wherein at least one of said conductive portions is in contact with said highly doped surface region.

5. A method according to claim 1, claim 2 or claim 4, wherein said pattern of conductive material is formed of refractory material.

6. A method according to claim 1, claim 2 or claim 4, wherein said pattern of conductive material is formed from at least one material chosen from the group comprising titanium, tantalum, molybdenum, tungsten, semiconductor material, and silicides of these materials.

* * * * *